US008729718B2

(12) United States Patent
Kuo et al.

(10) Patent No.: US 8,729,718 B2
(45) Date of Patent: May 20, 2014

(54) THERMOMAGNETIC GENERATOR

(75) Inventors: Chung-Jung Kuo, Taoyuan Hsien (TW);
Tze-Chern Mao, Taoyuan Hsien (TW);
Sheng-Fan Hsieh, Taoyuan Hsien (TW);
Ming-Tsz Lin, Taoyuan Hsien (TW);
Fu-Chou Hsiao, Taoyuan Hsien (TW);
Cheng-Yen Shih, Taoyuan Hsien (TW);
Mao-Jen Hsu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 343 days.

(21) Appl. No.: 13/284,612

(22) Filed: Oct. 28, 2011

(65) Prior Publication Data

US 2013/0106116 A1 May 2, 2013

(51) Int. Cl.
| | |
|---|---|
| *F02B 63/04* | (2006.01) |
| *F03G 7/08* | (2006.01) |
| *H02K 7/18* | (2006.01) |
| *H02N 10/00* | (2006.01) |
| *H02N 11/00* | (2006.01) |
| *H01L 37/04* | (2006.01) |
| *H03G 7/08* | (2006.01) |
| *H02K 35/02* | (2006.01) |
| *F02B 71/04* | (2006.01) |

(52) U.S. Cl.
CPC ............... *H02N 10/00* (2013.01); *H02N 11/00* (2013.01); *H01L 37/04* (2013.01); *H03G 7/08* (2013.01); *H02K 35/02* (2013.01); *H02K 7/1853* (2013.01); *F02B 63/04* (2013.01); *F02B 71/04* (2013.01)

USPC .......................................................... 290/1 R

(58) Field of Classification Search
CPC .... H02N 1010/00; H02N 11/00; H01L 37/04; F03G 7/08; H02K 35/02; H02K 7/1853; F02B 63/04; F02B 71/04
USPC .......................................................... 290/1 R
See application file for complete search history.

(56) References Cited

U.S. PATENT DOCUMENTS

2012/0013219 A1* 1/2012 Kuo et al. ..................... 310/306

OTHER PUBLICATIONS

Dan Solomon "Improving the performance of a thermomagnetic generator by cycling the magnetic field" *Journal of Applied Physics*, 1988 63(3), pp. 915-921.

* cited by examiner

*Primary Examiner* — Javaid Nasri
(74) *Attorney, Agent, or Firm* — Muncy, Geissler, Olds & Lowe, P.C.

(57) ABSTRACT

A thermomagnetic generator is provided, including a switch valve, a plurality of magnetic circuit units, a coil, and a plurality of inlet pipes connecting the magnetic circuit units to the switch valve. Each of the magnetic circuit units includes a magneto-caloric member. The switch valve repeatedly and alternatively switches at a predetermined frequency to guide hot and cold fluids to the magnetic circuit units, such that the magneto-caloric members are magnetized and demagnetized, respectively, by the cold and hot fluids. The coil is coupled to at least one of the magnetic circuit units for obtaining an induced voltage.

10 Claims, 4 Drawing Sheets

THERMOMAGNETIC GENERATOR

BACKGROUND OF THE INVENTION

1. Field of the Invention

This application relates in general to a thermomagnetic generator and in particular to a thermomagnetic generator applying hot and cold liquids.

2. Description of the Related Art

Thermomagnetic generators are devices that convert heat into electrical energy. They utilize the magnetic and magneto-caloric properties of magneto-caloric material which changes rapidly with temperature near a magnetic phase transition temperature, such as a Curie temperature. The magneto-caloric material is conventionally provided in a magnetic circuit. A coil or resonant circuit may be provided near the magnetic circuit for obtaining an induced voltage.

A temperature-varying device is usually provided in the thermomagnetic generator for varying the temperature of the magneto-caloric material. The temperature-varying device may apply hot and cold liquids through individual pipes to change the temperature of the magneto-caloric material above and below the magnetic phase transition temperature. The rapid variation of temperature above and below the magnetic phase transition temperature can magnetize or demagnetize the magneto-caloric material, so as to change the magnetic resistance (reluctance) of the magnetic circuit. Thus, an electrical voltage can be induced through the coil in response to the variation of the magnetic circuit. A typical configuration of a thermomagnetic generator can be found in the prior art of Solomon, Dan, "Improving the performance of a thermomagnetic generator by cycling the magnetic field", Journal of Applied Physics, volume 63, issue 3, pp. 915-921 (1988).

In conventional thermomagnetic generators, the hot and cold liquids are individually controlled by switch valves. When one pipe is opened to the magnetic circuit, the other pipe is closed. Thus, since the hot and cold liquids can not be continuously and simultaneously used, utility of the liquid and efficiency of the thermomagnetic generator is low.

BRIEF SUMMARY OF INVENTION

The application provides a thermomagnetic generator, including a switch valve, a plurality of magnetic circuit units, a coil, and a plurality of inlet pipes connecting the magnetic circuit units to the switch valve. Each of the magnetic circuit units includes a magneto-caloric member. The switch valve repeatedly and alternatively switches at a predetermined frequency to guide hot and cold fluids to the magnetic circuit units, such that the magneto-caloric members are magnetized and demagnetized, respectively, by the cold and hot fluids. The coil is coupled to at least one of the magnetic circuit units for obtaining an induced voltage.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
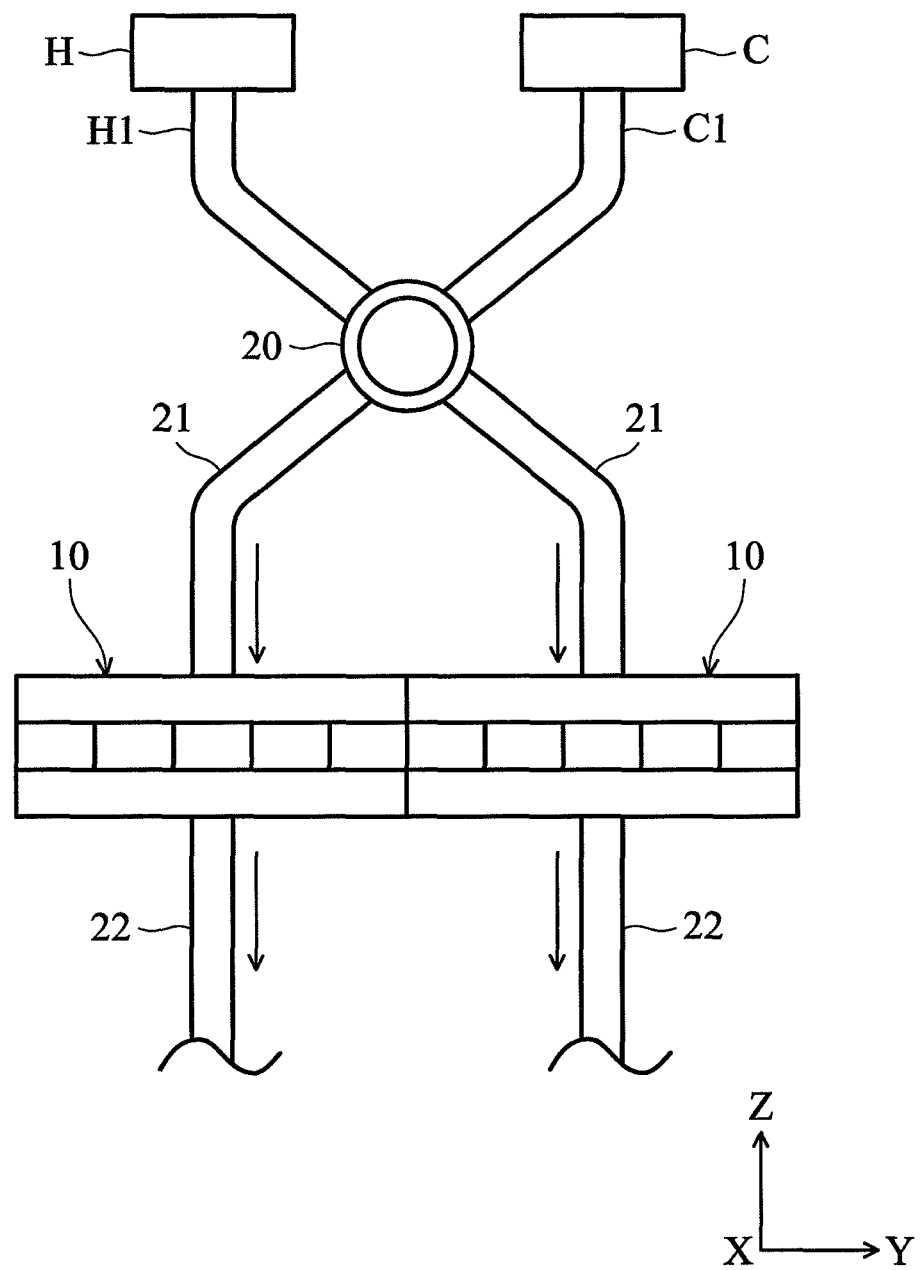
FIG. 1 is a perspective diagram of a thermomagnetic generator according to an embodiment of the invention.

FIG. 1 depicts an embodiment of a thermomagnetic generator which comprises a hot liquid source H, a hot liquid pipe H1, a cold liquid source C, a cold liquid pipe C1, a switch valve 20, two inlet pipes 21, two magnetic circuit units 10 arranged side by side, and two outlet pipes 22. As shown in FIG. 1, the hot and cold liquid pipes H1 and C1, respectively, extend from the hot and cold liquid sources H and C to the switch valve 20. Additionally, the two inlet pipes 2, respectively, extend from the switch valve 20 to the two magnetic circuit units 10.

In this embodiment, the hot and cold liquids are continuously pumped from the hot and cold liquid sources H and C through the hot and cold liquid pipes H1 and C1 to the switch valve 20. During operation, the switch valve 20 can individually allow communication of the hot liquid pipe H1 with one of the inlet pipes 21 at the left side, and communication of the cold liquid pipe C1 with the other inlet pipe 21 at the right side for a short period. Subsequently, the switch valve 20 reversely switches, such that communication of the hot liquid pipe H1 with the inlet pipes 21 at the right side is allowed, and communication of the cold liquid pipe C1 with the other inlet pipes 21 at the left side is allowed for a short period. With the repeated operations of the switch valve 20 at a predetermined frequency, an induced alternative voltage can be obtained by a coil or resonant circuit, which is coupled to the magnetic circuit units 10.

Figure 2:
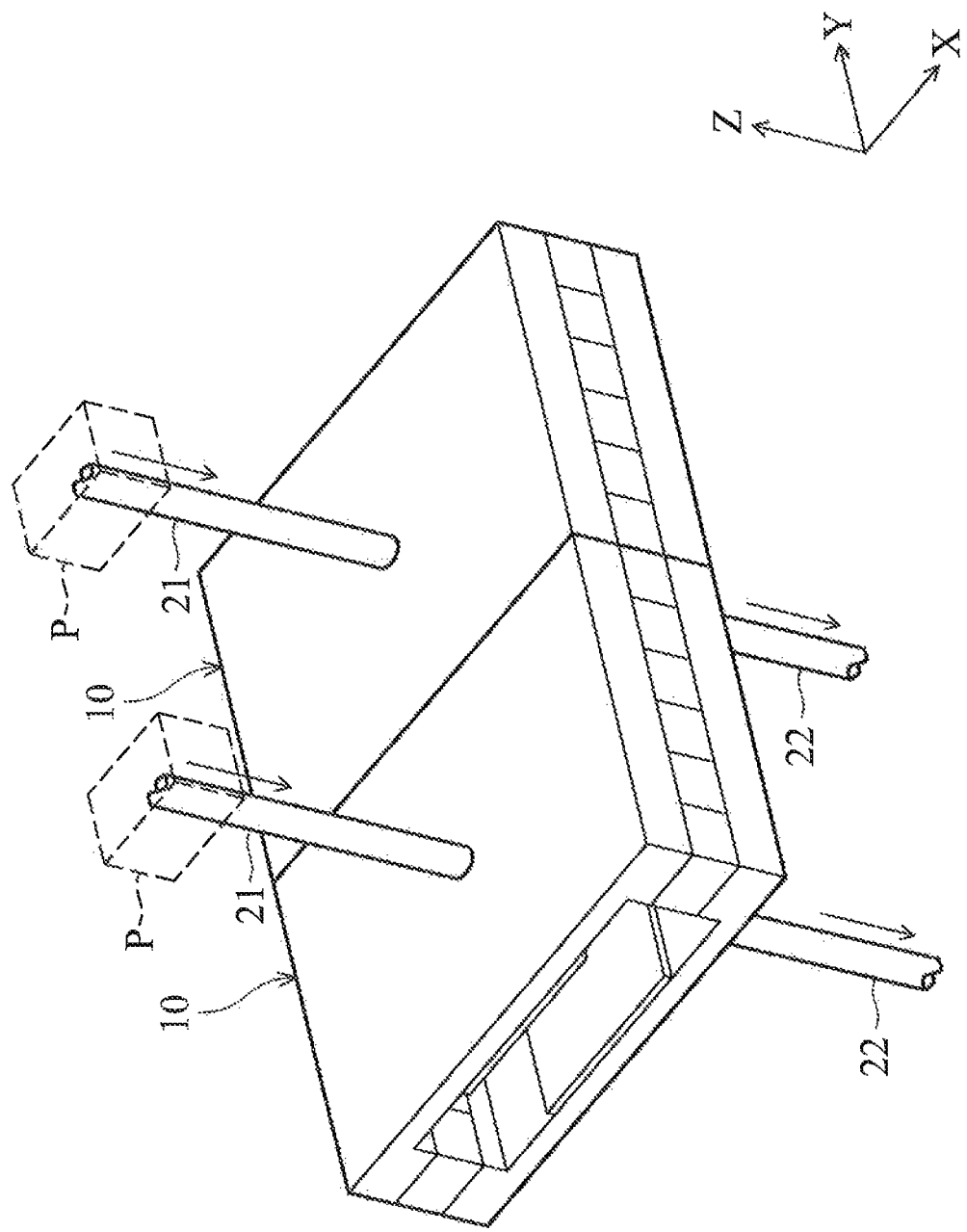
FIG. 2 is a perspective diagram of the magnetic circuit units, and the inlet and outlet pipes according to an embodiment of the invention.
Figure 3:
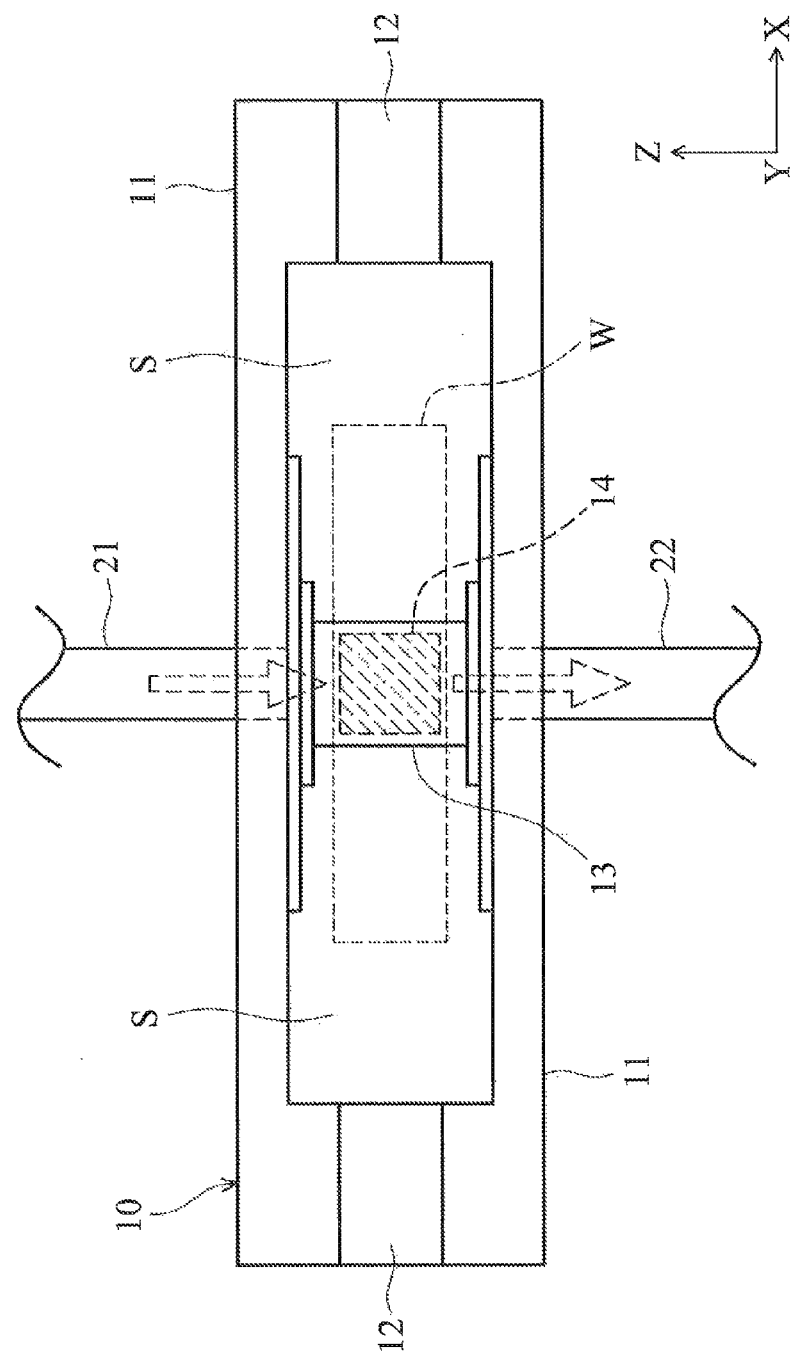
FIG. 3 is a side view of the magnetic circuit units, and the inlet and outlet pipes according to an embodiment of the invention.

Referring to FIGS. 2 and 3, the hot and cold liquids are, respectively, pumped (two pumps are indicated as P in FIG. 2) through the inlet pipes 21 to the magnetic circuit units 10 and discharged via the outlet pipes 22. In FIG. 3, each of the magnetic circuit unit 10 comprises two magnetic yokes 11, two permanent magnets 12 in contact between the magnetic yokes 11, and a hollow tube 13 disposed between the magnetic yokes 11, such that the inlet pipe 21 is communicated with the outlet pipe 22. The hot and cold liquids can be guided sequentially through the inlet pipes 21 and the hollow tube 13 and discharged via the outlet pipe 22. Specifically, a magneto-caloric member 14 made by gadolinium (Gd), gadolinium alloy or other magneto-caloric material (MCM) is disposed in the tube 13. In some embodiments, the magneto-caloric member 14 may have a porous structure to allow liquid to pass therethrough. In this embodiment, the magneto-caloric member 14 is cooled and magnetized when the cold liquid flows through the tube 13, and the magneto-caloric member 14 is heated and demagnetized when the hot liquid flows through the tube 13. By repeatedly applying the aforesaid heating and cooling processes, magnetic variation of the magneto-caloric member 14 cycles at a predetermined frequency. Thus, an induced voltage can be obtained by the coil (indicated as W in FIG. 3) or resonant circuit disposed in the space S of the magnetic circuit unit 10.

In some embodiments, two or more magnetic circuit units 10 can be applied with the hot and cold liquids passing therethrough via the corresponding inlet pipes 21. The hot and cold liquids may be industrial waste water produced by factories. As the hot and cold liquids can be continuously and simultaneously used all the time, high utility of the liquid is achieved. Namely, both of the hot and cold liquids through the magnetic circuit units 10 can be continuously and simultaneously utilized for generating electricity.

Figure 4:
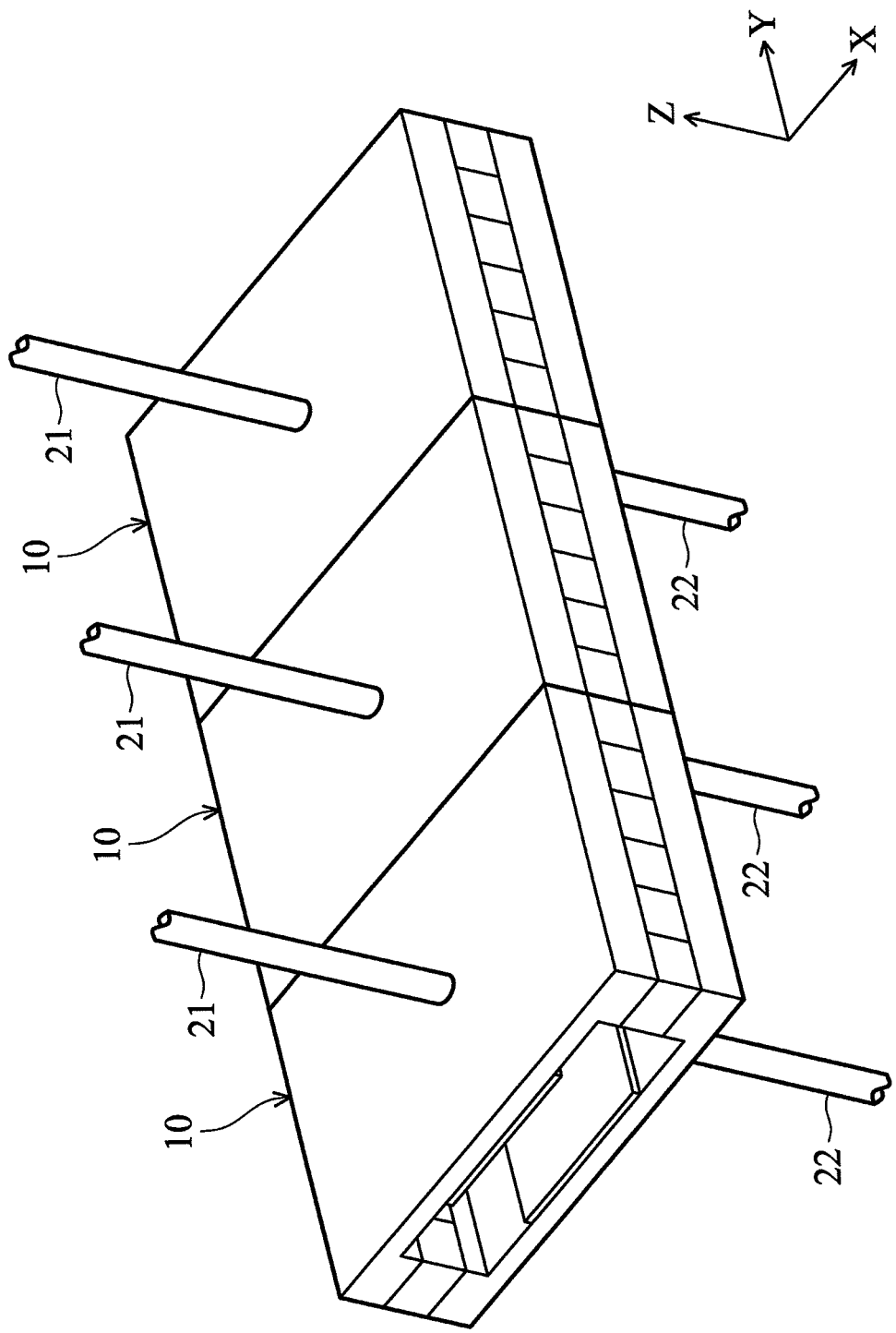
FIG. 4 is a perspective diagram of a thermomagnetic generator having three magnetic circuit units according to another embodiment of the invention.

Another embodiment of a thermomagnetic generator comprises more than two magnetic circuit units 10. Referring to FIG. 4, three inlet pipes 21 and three outlet pipes 21 and 22 are provided to respectively connect with three magnetic circuit units 10. The three inlet pipes 21 can be controlled by a switch valve (not shown), so as to alternatively provide hot and cold liquids to the magnetic circuit units 10. The liquids can be discharged through the outlet pipes 22 and recycled by a water treatment system. In some embodiments, the thermomagnetic generator may apply four or more magnetic circuit units 10, wherein the hot and cold liquids can be guided through the magnetic circuit units 10 at a predetermined frequency for electricity generation. Since the hot and cold liquids can be continuously and simultaneously used, utility of the liquid and efficiency of the thermomagnetic generator is improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A thermomagnetic generator, comprising:
   a switch valve;
   a hot liquid source;
   a hot liquid pipe, connecting the hot liquid source to the switch valve, wherein a hot fluid is pumped through the hot liquid pipe to the switch valve;
   a cold liquid source;
   a cold liquid pipe, connecting the cold liquid source to the switch valve, wherein a cold fluid is pumped through the cold liquid pipe to the switch valve;
   a plurality of magnetic circuit units, wherein each of the magnetic circuit units comprises a magneto-caloric member;
   a plurality of inlet pipes, respectively, connecting the magnetic circuit units to the switch valve, wherein the switch valve repeatedly switches at a predetermined frequency to guide the hot and cold fluids through the inlet pipes to the magnetic circuit units, and wherein the magneto-caloric members are magnetized and demagnetized in turns by the cold and hot fluids; and
   a coil, coupled to at least one of the magnetic circuit units for obtaining an induced voltage.

2. The thermomagnetic generator as claimed in claim 1, wherein the magnetic circuit unit further comprises two magnetic yokes and a tube disposed between the magnetic yokes for guiding the hot and cold fluids.

3. The thermomagnetic generator as claimed in claim 2, wherein the magneto-caloric member is disposed in the tube.

4. The thermomagnetic generator as claimed in claim 2, wherein the magnetic circuit unit further comprises two permanent magnets in contact between the magnetic yokes.

5. The thermomagnetic generator as claimed in claim 2, wherein the tube communicates with the inlet pipe.

6. The thermomagnetic generator as claimed in claim 2, wherein the magneto-caloric member comprises gadolinium, gadolinium alloy or other magneto-caloric material.

7. The thermomagnetic generator as claimed in claim 2, wherein the magneto-caloric member comprises a porous structure.

8. The thermomagnetic generator as claimed in claim 1, wherein the magnetic circuit units are arranged side by side.

9. The thermomagnetic generator as claimed in claim 1, wherein the thermomagnetic generator further comprises a plurality of outlet pipes, respectively, connected to the magnetic circuit units, for discharging the hot and cold fluids.

10. The thermomagnetic generator as claimed in claim 1, wherein the hot and cold liquids comprise water.

\* \* \* \* \*